United States Patent [19]

Shinoda et al.

[11] 4,125,832

[45] Nov. 14, 1978

[54] DIGITAL INFORMATION CONVERSION SYSTEM

[75] Inventors: Nobuhiko Shinoda, Tokyo; Nobuaki Sakurada; Tadashi Ito, both of Yokohama; Masayoshi Yamamichi, Kawasaki; Hiroyasu Murakami; Masayuki Suzuki, both of Tokyo, all of Japan

[73] Assignee: Canon Kabushiki Kaisha, Tokyo

[21] Appl. No.: 786,797

[22] Filed: Apr. 12, 1977

[30] Foreign Application Priority Data

Apr. 15, 1976 [JP] Japan .................................. 51-42940

[51] Int. Cl.² ............................................. H04L 3/00
[52] U.S. Cl. .......................... 340/347 DD; 340/347 P
[58] Field of Search .................... 340/347 P, 347 DD; 235/310, 311; 354/23 D

[56] References Cited

U.S. PATENT DOCUMENTS 3,728,715 4/1973 Shapiro ........................... 340/347 P Primary Examiner—Charles D. Miller
Attorney, Agent, or Firm—Toren, McGeady and Stanger

[57] ABSTRACT

A conversion system for a camera of a type controlled through computation of digital information. The system converts a coded digital value into a digital value of another coding. The code which comprises a gray code representing an integer part of the value and a code pattern representing a decimal part of the value is converted in such a manner that: The integer part is converted into a binary code while the decimal part is converted into a code to which a weight of ½, ¼ or ⅛ is applied. With such a method of conversion employed, values set at ⅓ increment or decrement steps such as ASA film sensitivity values are readily converted into binary codes to facilitate the computing operation of the camera.

13 Claims, 15 Drawing Figures

| EXPOSURE TIME | | APERTURE VALUE | | FILM SPEED | | OBJECT LUMINANCE | |
|---|---|---|---|---|---|---|---|
| SECOND | Tv | F-NUMBER | Av | ASA | Sv | FOOT LAMBEARTS | Bv |
| 1 | 0 | 1.0 | 0 | 3 | 0 | 1 | 0 |
| 1/2 | 1 | 1.4 | 1 | 6 | 1 | 2 | 1 |
| 1/4 | 2 | 2.8 | 2 | 12 | 2 | 4 | 2 |
| 1/8 | 3 | 4.0 | 3 | 25 | 3 | 8 | 3 |
| 1/16 | 4 | 5.6 | 4 | 50 | 4 | 16 | 4 |
| 1/30 | 5 | 8.0 | 5 | 100 | 5 | 32 | 5 |
| 1/60 | 6 | 11.0 | 6 | 200 | 6 | 64 | 6 |
| 1/125 | 7 | 16.0 | 7 | 400 | 7 | 125 | 7 |
| 1/250 | 8 | 22.0 | 8 | 800 | 8 | 250 | 8 |
| 1/500 | 9 | 32.0 | 9 | 1600 | 9 | 500 | 9 |
| 1/1000 | 10 | | | 3200 | 10 | 1000 | 10 |
| 1/2000 | 11 | | | 6400 | 11 | 2000 | 11 |
| | | | | 12500 | 12 | 4000 | 12 |

FIG.3

| Sv | Gi3 | Gi2 | Gi1 | Gi0 | GF1 | GF2 | Bi3 | Bi2 | Bi1 | Bi0 | BF1 | BF2 | BF3 |
|---|---|---|---|---|---|---|---|---|---|---|---|---|---|
| 0 | 0 | 0 | 0 | 0 | 0 | 1 | 0 | 0 | 0 | 0 | 0 | 0 | 0 |
| 1/3 | 0 | 0 | 0 | 0 | 0 | 0 | 0 | 0 | 0 | 0 | 0 | 1 | 1 |
| 2/3 | 0 | 0 | 0 | 0 | 1 | 0 | 0 | 0 | 0 | 0 | 1 | 0 | 1 |
| 1 | 0 | 0 | 0 | 1 | 1 | 0 | 0 | 0 | 0 | 1 | 0 | 0 | 0 |
| 1 1/3 | 0 | 0 | 0 | 1 | 1 | 1 | 0 | 0 | 0 | 1 | 0 | 1 | 1 |
| 1 2/3 | 0 | 0 | 0 | 1 | 0 | 1 | 0 | 0 | 0 | 1 | 1 | 0 | 1 |
| 2 | 0 | 0 | 1 | 1 | 0 | 1 | 0 | 0 | 1 | 0 | 0 | 0 | 0 |
| 2 1/3 | 0 | 0 | 1 | 1 | 0 | 0 | 0 | 0 | 1 | 0 | 0 | 1 | 1 |
| 2 2/3 | 0 | 0 | 1 | 1 | 1 | 0 | 0 | 0 | 1 | 0 | 1 | 0 | 1 |
| 3 | 0 | 0 | 1 | 0 | 1 | 0 | 0 | 0 | 1 | 1 | 0 | 0 | 0 |
| 3 1/3 | 0 | 0 | 1 | 0 | 1 | 1 | 0 | 0 | 1 | 1 | 0 | 1 | 1 |
| 3 2/3 | 0 | 0 | 1 | 0 | 0 | 1 | 0 | 0 | 1 | 1 | 1 | 0 | 1 |
| 4 | 0 | 1 | 1 | 0 | 0 | 1 | 0 | 1 | 0 | 0 | 0 | 0 | 0 |
| 4 1/3 | 0 | 1 | 1 | 0 | 0 | 0 | 0 | 1 | 0 | 0 | 0 | 1 | 1 |
| 4 2/3 | 0 | 1 | 1 | 0 | 1 | 0 | 0 | 1 | 0 | 0 | 1 | 0 | 1 |
| 5 | 0 | 1 | 1 | 1 | 1 | 0 | 0 | 1 | 0 | 1 | 0 | 0 | 0 |
| 5 1/3 | 0 | 1 | 1 | 1 | 1 | 1 | 0 | 1 | 0 | 1 | 0 | 1 | 1 |
| 5 2/3 | 0 | 1 | 1 | 1 | 0 | 1 | 0 | 1 | 0 | 1 | 1 | 0 | 1 |
| 6 | 0 | 1 | 0 | 1 | 0 | 1 | 0 | 1 | 1 | 0 | 0 | 0 | 0 |
| 6 1/3 | 0 | 1 | 0 | 1 | 0 | 0 | 0 | 1 | 1 | 0 | 0 | 1 | 1 |
| 6 2/3 | 0 | 1 | 0 | 1 | 1 | 0 | 0 | 1 | 1 | 0 | 1 | 0 | 1 |
| 7 | 0 | 1 | 0 | 0 | 1 | 0 | 0 | 1 | 1 | 1 | 0 | 0 | 0 |
| 7 1/3 | 0 | 1 | 0 | 0 | 1 | 1 | 0 | 1 | 1 | 1 | 0 | 1 | 1 |
| 7 2/3 | 0 | 1 | 0 | 0 | 0 | 1 | 0 | 1 | 1 | 1 | 1 | 0 | 1 |
| 8 | 1 | 1 | 0 | 0 | 0 | 1 | 1 | 0 | 0 | 0 | 0 | 0 | 0 |
| 8 1/3 | 1 | 1 | 0 | 0 | 0 | 0 | 1 | 0 | 0 | 0 | 0 | 1 | 1 |
| 8 2/3 | 1 | 1 | 0 | 0 | 1 | 0 | 1 | 0 | 0 | 0 | 1 | 0 | 1 |
| 9 | 1 | 1 | 0 | 1 | 1 | 0 | 1 | 0 | 0 | 1 | 0 | 0 | 0 |
| 9 1/3 | 1 | 1 | 0 | 1 | 1 | 1 | 1 | 0 | 0 | 1 | 0 | 1 | 1 |
| 9 2/3 | 1 | 1 | 0 | 1 | 0 | 1 | 1 | 0 | 0 | 1 | 1 | 0 | 1 |
| 10 | 1 | 1 | 1 | 1 | 0 | 1 | 1 | 0 | 1 | 0 | 0 | 0 | 0 |
| 10 1/3 | 1 | 1 | 1 | 1 | 0 | 0 | 1 | 0 | 1 | 0 | 0 | 1 | 1 |
| 10 2/3 | 1 | 1 | 1 | 1 | 1 | 0 | 1 | 0 | 1 | 0 | 1 | 0 | 1 |
| 11 | 1 | 1 | 1 | 0 | 1 | 0 | 1 | 0 | 1 | 1 | 0 | 0 | 0 |
| 11 1/3 | 1 | 1 | 1 | 0 | 1 | 1 | 1 | 0 | 1 | 1 | 0 | 1 | 1 |
| 11 2/3 | 1 | 1 | 1 | 0 | 0 | 1 | 1 | 0 | 1 | 1 | 1 | 0 | 1 |
| 12 | 1 | 0 | 1 | 0 | 0 | 1 | 1 | 0 | 0 | 0 | 0 | 0 | 0 |
| 12 1/3 | 1 | 0 | 1 | 0 | 0 | 0 | 1 | 0 | 0 | 0 | 0 | 1 | 1 |
| 12 2/3 | 1 | 0 | 1 | 0 | 1 | 0 | 1 | 0 | 0 | 0 | 1 | 0 | 0 |

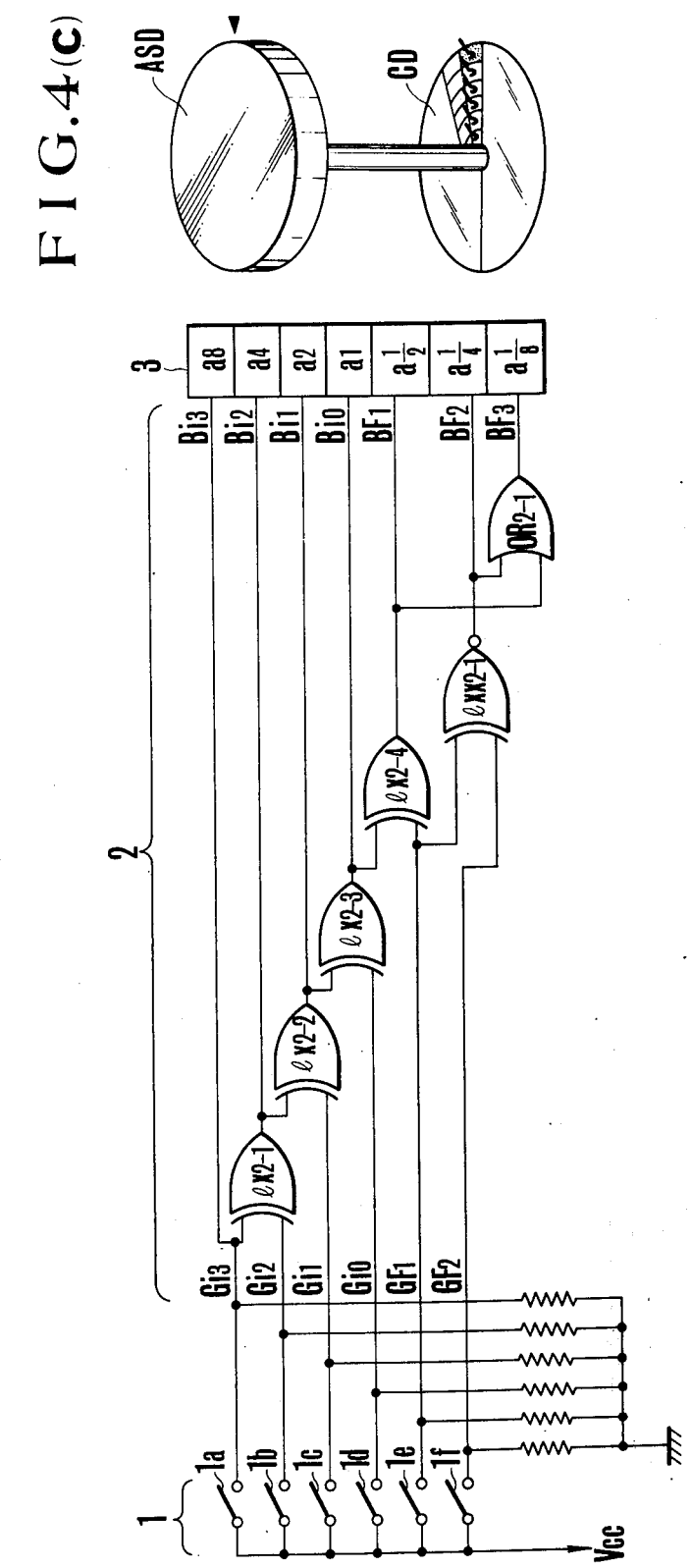

FIG.7

| Sv | Gi3 | Gi2 | Gi1 | Gi0 | GF1 | GF2 | Bi3 | Bi2 | Bi1 | Bi0 | BF1 | BF2 | BF3 |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 1/3 | 0 | 0 | 0 | 0 | 0 | 1 | 0 | 0 | 0 | 0 | 0 | 1 | 1 |
| 2/3 | 0 | 0 | 0 | 0 | 1 | 1 | 0 | 0 | 0 | 0 | 1 | 0 | 1 |
| 1 | 0 | 0 | 0 | 1 | 1 | 0 | 0 | 0 | 0 | 1 | 0 | 0 | 0 |
| 1 1/3 | 0 | 0 | 0 | 1 | 1 | 1 | 0 | 0 | 0 | 1 | 0 | 1 | 1 |
| 1 2/3 | 0 | 0 | 0 | 1 | 0 | 1 | 0 | 0 | 0 | 1 | 1 | 0 | 1 |
| 2 | 0 | 0 | 1 | 1 | 0 | 0 | 0 | 0 | 1 | 0 | 0 | 0 | 0 |
| 2 1/3 | 0 | 0 | 1 | 1 | 0 | 1 | 0 | 0 | 1 | 0 | 0 | 1 | 1 |
| 2 2/3 | 0 | 0 | 1 | 1 | 1 | 1 | 0 | 0 | 1 | 0 | 1 | 0 | 1 |
| 3 | 0 | 0 | 1 | 0 | 1 | 0 | 0 | 0 | 1 | 1 | 0 | 0 | 0 |
| 3 1/3 | 0 | 0 | 1 | 0 | 1 | 1 | 0 | 0 | 1 | 1 | 0 | 1 | 1 |
| 3 2/3 | 0 | 0 | 1 | 0 | 0 | 1 | 0 | 0 | 1 | 1 | 1 | 0 | 1 |
| 4 | 0 | 1 | 1 | 0 | 0 | 0 | 0 | 1 | 0 | 0 | 0 | 0 | 0 |
| 4 1/3 | 0 | 1 | 1 | 0 | 0 | 1 | 0 | 1 | 0 | 0 | 0 | 1 | 1 |
| 4 2/3 | 0 | 1 | 1 | 0 | 1 | 1 | 0 | 1 | 0 | 0 | 1 | 0 | 1 |
| 5 | 0 | 1 | 1 | 1 | 1 | 0 | 0 | 1 | 0 | 1 | 0 | 0 | 0 |
| 5 1/3 | 0 | 1 | 1 | 1 | 1 | 1 | 0 | 1 | 0 | 1 | 0 | 1 | 1 |
| 5 2/3 | 0 | 1 | 1 | 1 | 0 | 1 | 0 | 1 | 0 | 1 | 1 | 0 | 1 |
| 6 | 0 | 1 | 0 | 1 | 0 | 0 | 0 | 1 | 1 | 0 | 0 | 0 | 0 |
| 6 1/3 | 0 | 1 | 0 | 1 | 0 | 1 | 0 | 1 | 1 | 0 | 0 | 1 | 1 |
| 6 2/3 | 0 | 1 | 0 | 1 | 1 | 1 | 0 | 1 | 1 | 0 | 1 | 0 | 1 |
| 7 | 0 | 1 | 0 | 0 | 1 | 0 | 0 | 1 | 1 | 1 | 0 | 0 | 0 |
| 7 1/3 | 0 | 1 | 0 | 0 | 1 | 1 | 0 | 1 | 1 | 1 | 0 | 1 | 1 |
| 7 2/3 | 0 | 1 | 0 | 0 | 0 | 1 | 0 | 1 | 1 | 1 | 1 | 0 | 1 |
| 8 | 1 | 1 | 0 | 0 | 0 | 0 | 1 | 0 | 0 | 0 | 0 | 0 | 0 |
| 8 1/3 | 1 | 1 | 0 | 0 | 0 | 1 | 1 | 0 | 0 | 0 | 0 | 1 | 1 |
| 8 2/3 | 1 | 1 | 0 | 0 | 1 | 1 | 1 | 0 | 0 | 0 | 1 | 0 | 1 |
| 9 | 1 | 1 | 0 | 1 | 1 | 0 | 1 | 0 | 0 | 1 | 0 | 0 | 0 |
| 9 1/3 | 1 | 1 | 0 | 1 | 1 | 1 | 1 | 0 | 0 | 1 | 0 | 1 | 1 |
| 9 2/3 | 1 | 1 | 0 | 1 | 0 | 1 | 1 | 0 | 0 | 1 | 1 | 0 | 1 |
| 10 | 1 | 1 | 1 | 1 | 0 | 0 | 1 | 0 | 1 | 0 | 0 | 0 | 0 |
| 10 1/3 | 1 | 1 | 1 | 1 | 0 | 1 | 1 | 0 | 1 | 0 | 0 | 1 | 1 |
| 10 2/3 | 1 | 1 | 1 | 1 | 1 | 1 | 1 | 0 | 1 | 0 | 1 | 0 | 1 |
| 11 | 1 | 1 | 1 | 0 | 1 | 0 | 1 | 0 | 1 | 1 | 0 | 0 | 0 |
| 11 1/3 | 1 | 1 | 1 | 0 | 1 | 1 | 1 | 0 | 1 | 1 | 0 | 1 | 1 |
| 11 2/3 | 1 | 1 | 1 | 0 | 0 | 1 | 1 | 0 | 1 | 1 | 1 | 0 | 1 |
| 12 | 1 | 0 | 1 | 0 | 0 | 0 | 1 | 1 | 0 | 0 | 0 | 0 | 0 |
| 12 1/3 | 1 | 0 | 1 | 0 | 0 | 1 | 1 | 1 | 0 | 0 | 0 | 1 | 1 |
| 12 2/3 | 1 | 0 | 1 | 0 | 1 | 1 | 1 | 1 | 0 | 0 | 1 | 0 | 0 |

FIG. 10(b)

DIGITAL INFORMATION CONVERSION SYSTEM

FIELD OF THE INVENTION

This invention relates to a digital information conversion system suitable for use in a camera controlled through computation of digital information.

DESCRIPTION OF THE PRIOR ART

Generally, exposure control of a photographing machine such as a camera is performed by controlling either an aperture value or exposure time through computation after obtaining information on the brightness or luminance of an object to be photographed and the sensitivity or speed of the film being used. To simplify the computation, the information or data required for exposure control are generally converted into APEX values before computation. The exposure time which is given in second, the aperture values which are given in F-number, the film speed (sensitivity) which is given in ASA sensitivity value and the object's luminance which is given in Foot Lambearts value are all arranged in multiplicative sequences. Whereas, in the APEX value system, these values of multiplicative sequences are rearranged into arithmetical sequences as indicated in FIG. 1 of the accompanying drawings. Therefore, such computation is simplified by the use of the APEX system. In FIG. 1 the APEX system is used to express the exposure time in value $Tv$, aperture value in $Av$, film speed in $Sv$ and the brightness or luminance of photographing object in $Bv$.

With the APEX system employed, the exposure computation is extremely simplified irrespective as to whether it is electrical or mechanical computation, because what is required is just to make addition and subtraction to satisfy the relation $$Bv + Sv = Tv + Av \tag{1}$$

Such APEX values are also effectively applicable to the simplification of various devices which have often been proposed in recent years for digital exposure computation. Unlike an analog system, however, there is an inevitable limit to the attainable theoretical precision in a digital system, because of the bit capacity thereof. In order to attain a desired theoretical precision in a digital system, the number of bits that express figures below "1" in APEX value should be increased. However, when the errors that exist in the device arrangement and in measurement are taken into consideration, an extremely high precision is unnecessary.

Assuming that 7 bits as shown in FIG. 2 of the accompanying drawings are used for converting the value of each factor required for exposure control into an APEX value, the weights of "1", "2", "4" and "8" are given to the upper four bits $a1$, $a2$, $a4$ and $a8$ while the weights of "$\frac{1}{2}$", "$\frac{1}{4}$" and "$\frac{1}{8}$" are given to the lower three bits $a\frac{1}{2}$, $a\frac{1}{4}$ and $a\frac{1}{8}$. By this, a degree of precision up to "$\frac{1}{8}$" can be attained.

Accordingly, each of the photometric information, film speed information, exposure time information and aperture value information can be converted into a digital value of 7 bits as shown in FIG. 2 before computation is carried out for exposure control, so that such exposure computation can be performed at a relatively high precision.

Further, as for APEX values below "1", the lower three bits $a\frac{1}{2}$, $a\frac{1}{4}$ and $a\frac{1}{8}$ shown in FIG. 2 may be used for handling value of $\frac{1}{8}$, 2/8, $\frac{3}{8}$, 4/8, $\frac{5}{8}$, 6/8 and $\frac{7}{8}$. However, the sensitivity of the commercially available films being used for photographing purposes are usually set at $\frac{1}{3}$ increment or decrement step in APEX value. Accordingly, the input setting for film sensitivity information must be made at an increment rate of $\frac{1}{3}$ in APEX value in such a manner as ASA 16, 20, 25, 32, 40, 50, 64, 80, 100, 125, 160, 200, . . .

However, if only the factor relative to film speed is set at $\frac{1}{3}$ increment step while other factors of exposure control are set at $\frac{1}{8}$ increment, it would be impossible to make matching among factors for digital computation unless a complex computing operation is carried out involving multiplication and division. On the other hand, if the results of computation for actual exposure control are obtainable at an increment or decrement step of $\frac{1}{8}$, such a complex computation becomes meaningless.

To avoid such a meaningless computing operation, therefore, the applicant of the present application has previously proposed a method of approximating the data of $\frac{1}{3}$ increment to data of $\frac{1}{8}$ increment or decrement step. In accordance with such a method, $\frac{1}{3}$ and 2/3 can be expressed by:

$$\frac{1}{3} = \frac{1}{4} + \frac{1}{8} = 0.375 \tag{2}$$

$$\frac{2}{3} = \frac{1}{2} + \frac{1}{8} = 0.625 \tag{3}$$

In this manner, the data of $\frac{1}{3}$ increment can be approximately made into data of $\frac{1}{8}$ increment. Such an approximating process results in an error of ±0.024 step, which is sufficiently tolerable as compared with an error of 0.125 step. However, such a method is usable only for conversion from binary codes. When exposure information such as film sensitivity is supplied in a form of a digital value, a code disc is generally used for converting the exposure information into a binary value to obtain a digital value. In cases where such a code disc is used for conversion into a digital value, however, a read-out error tends to arise, depending on the characteristic of the code, if the binary code is printed directly to the code disc. In such a case, therefore, a gray code is usually used. The exposure information is first converted into a gray code before it is converted into a binary code. However, if the gray code is converted directly into the binary code in an ordinary manner, code conversion that satisfies the formulas (2) and (3) could not be effected and the results of conversion would not be expressed in $\frac{1}{8}$ increment or decrement step precision. Thus, it has been impossible to express $\frac{1}{8}$ step precision from gray codes.

SUMMARY OF THE INVENTION

It is an object of this invention to provide a system which is capable of converting, from gray codes, data of $\frac{1}{3}$ increment or decrement step precision into data of approximately $\frac{1}{8}$ step precision.

It is another object of this invention to provide a code disc for converting, from gray codes, data of $\frac{1}{3}$ step precision into data of $\frac{1}{8}$ step precision.

It is still another object of this invention to provide a conversion circuit for converting, from gray codes, data of $\frac{1}{3}$ step precision into data of $\frac{1}{8}$ step precision.

These and further objects, features and advantages of this invention will become apparent from the following detailed description taken in connection with the accompanying drawings.

BRIEF DESCRIPTION OF THE DRAWINGS

FIG. 3 is a comparison table relative to this invention comparing gray codes, binary codes and ASA value Sv.

FIG. 7 is a comparison table illustrating another code arrangement of the digital information conversion system of this invention.

DESCRIPTION OF THE EMBODIMENTS OF THE INVENTION

Figures 1, 2:
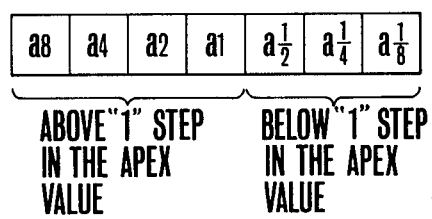
FIG. 1 is a comparison table comparing the physical values of factors relative to exposure control.
FIG. 2 illustrates the weight of each bit obtained when an APEX value is converted into a digital value at ⅛ step precision.

The details of the digital information conversion system of this invention are described as follows: In FIG. 3 which is a table showing film speed values equivalent to APEX values, gray codes corresponding to these film speed values and binary codes corresponding to these gray codes, symbols G13 - GI0 represent the integer part (binary) of the gray code; GF1 and GF2 represent its decimal part (ternary); B13 - B10 represent the output of the integer part converted into a binary code; and BF1, BF2 and BF3 represent the output of the binary coded decimal part having weights of ½, ¼ and ⅛ respectively. The values of the BF1, BF2 and BF3 are determined to satisfy the above mentioned formulas (2) and (3). The decimal parts GF1 and GF2 on the gray code side are so arranged that the code for an odd number is made to differ from the code for an even number in such a way as to satisfy corresponding BF1, BF2 and BF3. Further, in this table, the relation of the integer part of the gray code to the integer part of the binary code is arranged to be:

$$Bin = Bi + 1 \oplus Gin \quad (4)$$

wherein $\oplus$ is expressed by "exclusive OR". The decimal part is arranged to be a ternary input as defined in FIG. 3. Namely the ternary scale is arranged in such a manner that the part progresses in the order of 01, 00, 10 when the data value converted into a binary code is an even number and in the order of 10, 11, 01 when the binary converted value of data is an odd number. By this, BF1 can be handled in the same manner as an integer and can be expressed as follows:

$$BF1 = B\overline{i0} \oplus GF1 \quad (5)$$

and BF2 can be expressed as follows:

$$BF2 = \overline{GF1 \oplus GF2} = \overline{GF2 \oplus Bi0} \cdot \overline{BF1} \quad (6)$$

wherein "·" represents "and", while BF3 can be expressed as:

$$BF3 = BF1 + Bf2 \quad (7)$$

wherein "+" can be represented by "or." FIG.4(a) is a circuit diagram illustrating as an embodiment of this invention a circuit provided for converting the codes which are in relation as described in the foregoing and as shown in FIG. 3. In FIG. 4(a), a reference numeral 1 indicates a switch of 6 bits which is interlocked with an ASA sensitivity setting dial ASD to be selectively operated thereby; 2 indicates a conversion circuit provided for converting the gray code which is set by the switch 2 into a binary code, $l \times n2-1 - l \times 2-3$ representing "exclusive OR," OR2-1 representing "or" and $l \times n2-1$ representing a logic obtained with the "exclusive OR" inverted. A reference numeral 3 indicates a register of 7 bits wherein weights of "1", "2", "4" and "8" are given to the upper 4 bits a1, a2, a4 and a8 while weights of "½," "¼" and "⅛" are given to the lower 3 bits a½, a¼ and a⅛ respectively. In the outputs Bi3 - Bi0 of the above stated conversion circuit Bi0 is an "exclusive OR" of Gi0 and Bi1; Bi1 is an "exclusive OR" of Gi1 and Bi2; Bi2 is an "exclusive OR" of Gi2 and Bi3; and Bi3 is Gi3. The outputs of the conversion circuit thus correspond to the above stated formula (4). Accordingly, the integer part Gi3 - Gi0 of the gray code is converted into the binary integer part Bi0 - Bi3. Further, BF1 is an "exclusive OR" of GF1 and Bi0 and thus corresponds to formula (5); BF2 is an inverted exclusive OR of GF1 and GF2 and thus corresponds to formula (6); and BF3 is an OR of BF1 and BF2 and thus corresponds to formula (7). In this manner, the gray code of the film sensitivity which is set according to the on or off state of the switches 1 in response to the operation of ASA sensitivity dial is supplied to the register 3 in the form of a binary code down to a ⅛ step. Assuming that a Sv value of 1⅛ is set by means of the ASA sensitivity dial, the switch 1 is operated based on a gray code corresponding to 1⅛ in such a manner that switches 1a - 1c are turned off and switches 1d - 1f are turned on. Therefore, Gi3 - Gi1 become "0"; Gi0 - GF2 become "1"; Bi3 - Bi1 become "0"; Bi0 becomes "1"; BF1 becomes "0"; BF2 becomes "1"; and BF3 becomes "1". At the register 3, a3 and a2 become "0"; a1 become "1"; a½ becomes "0"; and a¼ and a⅛ become "1". Since a1 is weighted to "1", a¼ to "¼" and a⅛ to "⅛," they become 1 + ¼ + ⅛. In accordance with formula (2), therefore, an input of approximately 1 + ⅛ can be obtained.

FIG. 4(b) illustrates a code disc as an embodiment example corresponding to the table shown in FIG. 3. In FIG. 4(b), white parts represent nonconductive parts and black parts represent conductive parts; reference numerals 1a - 1f indicate switches which are the same as those indicated in FIG. 4(a). The switches are turned on when they are connected to the black parts. FIG. 4(c) illustrates the arrangement of an ASD dial in relation to the code disc CD shown in FIG. 4(b).

Figure 4:
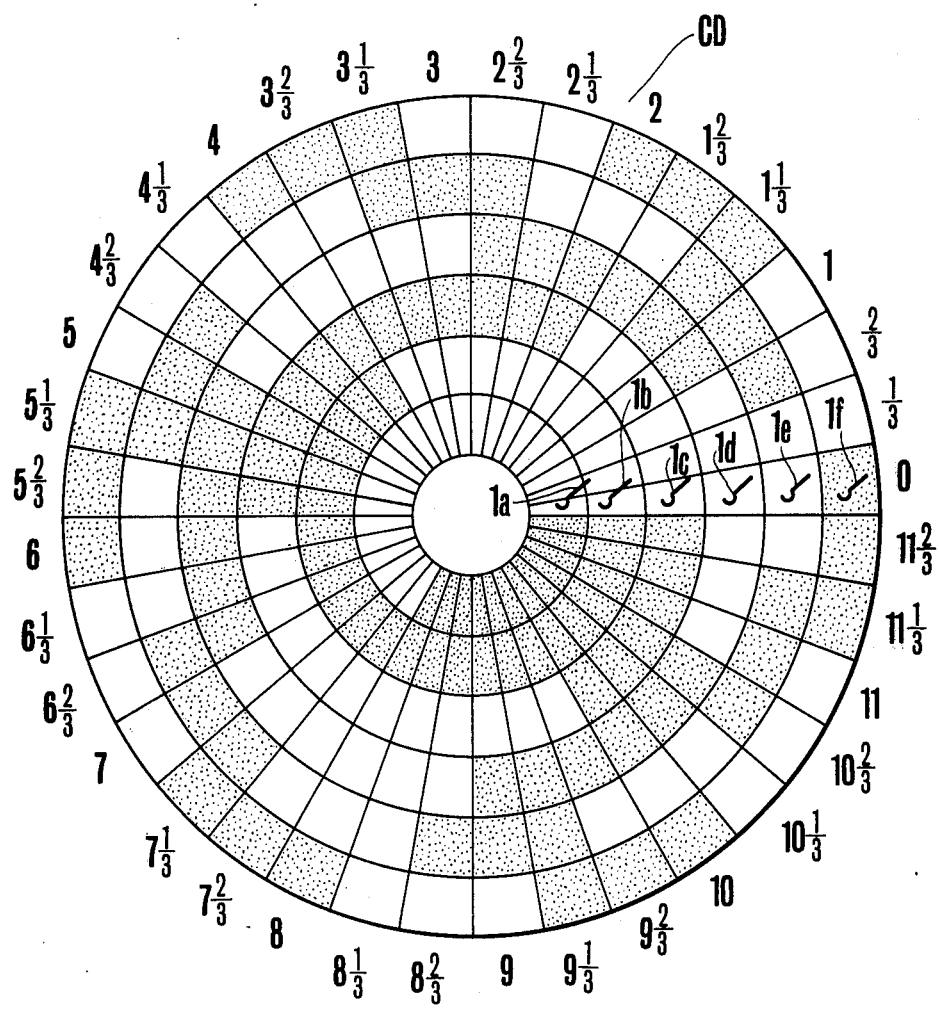
FIG. 4(a) is a circuit diagram illustrating an embodiment example of the digital information conversion system of this invention.
FIG. 4(b) illustrates a code disc corresponding to the table of FIG. 3.
FIG. 4(c) illustrates an arrangement between an ASA dial and the code disc CD shown in FIG. 4(c).
Figure 5:
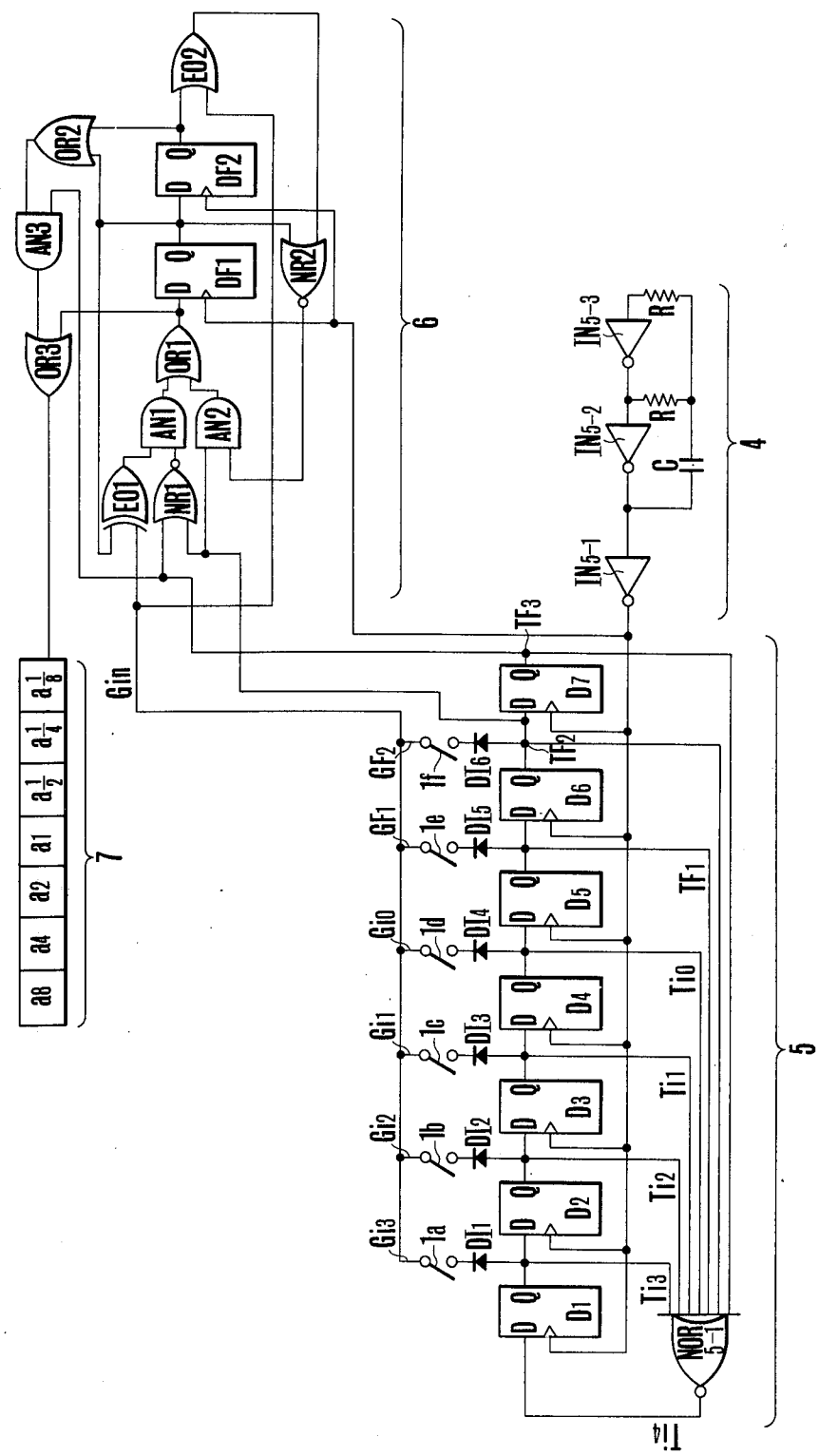
FIG. 5 illustrates a circuit as another embodiment example of this invention.

FIG. 5 is a circuit diagram illustrating another embodiment of this invention which shows an example of serial input arrangement. In FIG. 5, a reference numeral 4 indicates a clock pulse oscillator which is composed of a capacitor C, a resistance R and inverters IN5-1 – IN5-3. A reference numeral 5 indicates a ring counter which is composed of 7 delay flip-flops D1 - D7 and a NOR gate NOR5-1. Diodes DI1 - DI6 are connected to the output terminals of the flip-flops. Switches 1a - 1f which are also indicated in FIG. 4 are on-off controlled by the operation of the ASA sensitivity setting dial. A reference numeral 6 indicates a conversion circuit which converts the gray code into a binary code and is composed of exclusive ORs Eo1 and Eo2, AND gates AN1, AN2 and AN3, OR gates OR1, OR2 and OR3, NOR gates NR1 and NR2 and delay flip-flops DF1 and DF2. A reference numeral 7 indicates a shift register to which weights are given in the same manner as the shift register shown in FIG. 4.

Figure 6:
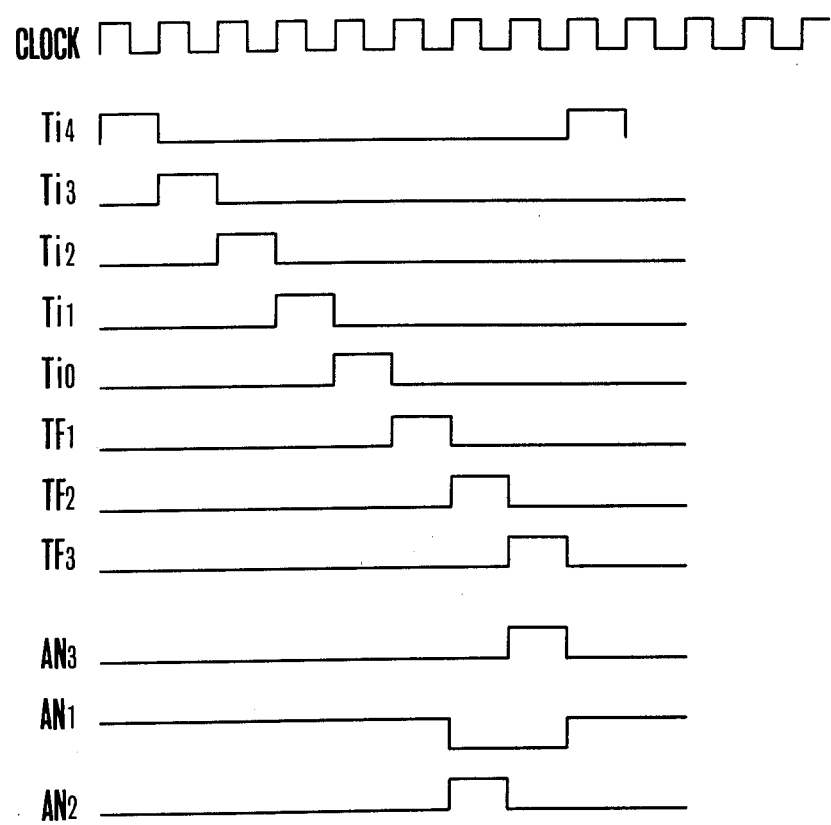
FIG. 6 is a timing chart illustrating the operation of the circuit illustrated in FIG. 5.

FIG. 6 is a timing chart showing the timing of the operation of the circuit illustrated in FIG. 5. The timing of the circuit of FIG. 5 is as described below:

Referring to FIG. 5 and 6, the output terminals Ti4 - TF3 of the ring counter are arranged to produce outputs at the timing as shown in FIG. 6. For this purpose, the AND gate AN3 opens only when the output terminal TF3 produces an output. Since the input terminal of the AND gate AN1 is connected to the output terminals TF2 and TF3 of the delay flip-flop D6 and D7 through the NOR gate NR1, the AND gate AN1 comes into an open state only when no output is produced from the output terminals TF2 and TF3. Further, since the input terminal of the AND gate AN2 is connected to the output terminal TF2 of the delay flip-flop D6, the AND gate AN2 is turned on only when the output terminal TF3 is producing an output. Therefore, the information supplied to the register 7 before an output is produced by the delay flip-flop D5, i.e. up to the information Gi3 - GF1 obtained through switches from 1a through 1e will be an output excluding the exclusive OR Eo1 between Gin and the output Bin+1 of the delay flip-flop DF1. Thus the output Bi3 - BF1 produced by the conversion circuit comes to correspond to the above-mentioned formulas (4) and (5). In this manner, outputs obtained by converting the gray code into a binary code in accordance with formulas (4) and (5) will be supplied to the register covering the bits from $a3$ up to $a\frac{1}{4}$ thereof.

Further, since the information to be supplied to $a\frac{1}{4}$ is supplied through the AND gate AN2, the information is an output obtained through the NOR gate NR2 from an output obtained through the exclusive OR E02 between GF2 and Bi0 which is an output of the delay flip-flop DF2 and from BF1 which is an output of the delay flip-flop DF1. This can be expressed by $\overline{GF1 \oplus Bi0 + BF1}$. This formula can be modified to correspond to the above mentioned formula (6). Therefore, BF2 which is obtained through formula (6) is supplied to $a\frac{1}{4}$. The information to be supplied to $a\frac{1}{8}$ is supplied through the AND gate AN3. The information, therefore, will be the result of OR between the outputs BF1 and BF2 of the delay flip-flops DF1 and DF2. Thus, the value BF3 which is obtained through formula (7) is supplied to $a\frac{1}{8}$. The gray code which is set at switches 1a - 1f is thus converted into a binary code down to the $\frac{1}{8}$ step before it is supplied to the register.

Let us assume that an unillustrated ASA sensitivity setting dial is operated to set a Sv value $1\frac{1}{8}$, for example, the switches 1a - 1c are turned off and switches 1d - 1f are turned on because in this case Gi3 - Gi1 are "0" and Gi0 - GF2 are "1". Therefore, when the output Ti3 of the flip-flop D1 of the ring counter is produced, the condition Gi3 = "0" of the switch 1a is transmitted to one of the input terminals of Eo1. On the other hand, since the output of the DF1 is "0," the output of Eo1 becomes "0." Therefore, the output of AN1 also becomes "0." Meanwhile, since the output of D6 is also "0," the output of AN2 is also "0." Then, Bi3 = "0" is transmitted to the register 7 through the OR gates OR1 and OR3. Next, D2 produces an output and the condition of Gi2 is transmitted to one of the input terminals of Eo1. Since the output of DF1 then has become the condition of Bi3, the output of Eo1 becomes Gi2 ⊕ Bi3. Since Gi2 = "0" and Bi3 = "0", Bi2 = "0". Thus, Bi2 = "0" is supplied to the register 7 through the OR gates OR1 and OR3. Following this, D3 produces an output and the condition "0" of Gi1 is transmitted to one of the input terminals of Eo1. Since the output of DF1 is Bi2 at this time, Bi2 ⊕ Gi1 = Bi1 = "0" is supplied to the register 7. Then, D4 produces an output and the condition of Gi0 = "1" is transmitted to one of the input terminals of Eo1 and, since the output of DF1 is Bi1, Bi1 ⊕ Gi0 = Bi0 = 1 is transmitted to the register 7. Following this, D5 produces an output to transmit the condition of GF1 = "1" to one of the input terminals of Eo1. Since the output of DF1 is then Bi0, Bi0 ⊕ GF1 = BF1 = "0" is supplied to the register 7. After this, D6 produces an output and the condition of GF2 = "1" is transmitted to one of the input terminals of Eo1. However, since the output of D6 then is transmitted to NR1, the output of AN1 becomes "0" and the output condition of Eo1 is not transmitted to the register 7. On the other hand, the output "1" of D6 is then transmitted to one of the input terminals of AN2 and the output of AN2 is determined by the output of NR2. Since one of the input terminals of NR2 is connected to the output terminal of DF1, BF1 = "0" is transmitted to the input terminal thereof. On the other hand, the output Bi0 of DF2 is transmitted to one of the input terminals of Eo2 while GF2 is transmitted to the other terminal of Eo2. The output Bi0 ⊕ GF2 is transmitted to the other input terminal of NR2. Therefore, the output of NR2 becomes $\overline{BF1 + Bi0 \oplus GF2}$, which can be converted by the DeMorgan's law to $\overline{BF1} \cdot \overline{Bi0 + GF2}$. Therefore, through formula (6), BF2 = "1" is supplied to the register 7. Then, D7 produces an output to transmit "1" to one of the input terminals of AN3. Accordingly, an output BF1 + BF2 = BF3 = "1" which is obtained through the OR gate OR2 from the outputs BF2 and BF1 of DF1 and DF2 is supplied to the register 7. through such processes, Bi3 - Bi1 become "0"; Bi0 becomes "1"; BF1 becomes "0"; BF2 becomes "1"; and BF3 becomes "1", so that the value $1\frac{1}{8}$ is approximately converted into a binary code and supplied in the same manner as in the case of FIG. 4.

FIG. 7 is a table illustrating the code arrangement of another embodiment example of the digital information conversion system of this invention showing the relation of gray codes, binary codes corresponding thereto and the Sv values of ASA to one another. The same symbols as those of FIG. 3 are used for indicating input and output signals. In the binary parts of this table, for the purpose of conversion into information by ⅓ steps in accordance with formulas (2) and (3), the decimal part BF1 - BF3 is arranged to repeat the changes of "0,0,0", "0,1,1" and "1,0,1." On the other hand, GF1 and GF2 on the side of the gray code corresponding to the decimal part are arranged in such a manner that the code pattern changes according as the integer part is an odd number or an even number, i.e. "1,0", "1,1" and "0,1" when the integer part is an odd number and "0,0", "0,1" and "1,1" when the integer part is an even number. The decimal part BF1 - BF3 is thus arranged to satisfy formulas (2) and (3). As for the relation of Gi3 - GF2 to Bi3 - BF3 there obtain the following logical relations:

$$Bin = Bin+1 \oplus Gin \qquad (7)$$

$$BF1 = Bi0 \oplus GF1 \qquad (8)$$

$$BF2 = BF1 \oplus GF2 \qquad (9)$$

$$BF3 = BF1 + BF2 \qquad (10)$$

Figure 8A:
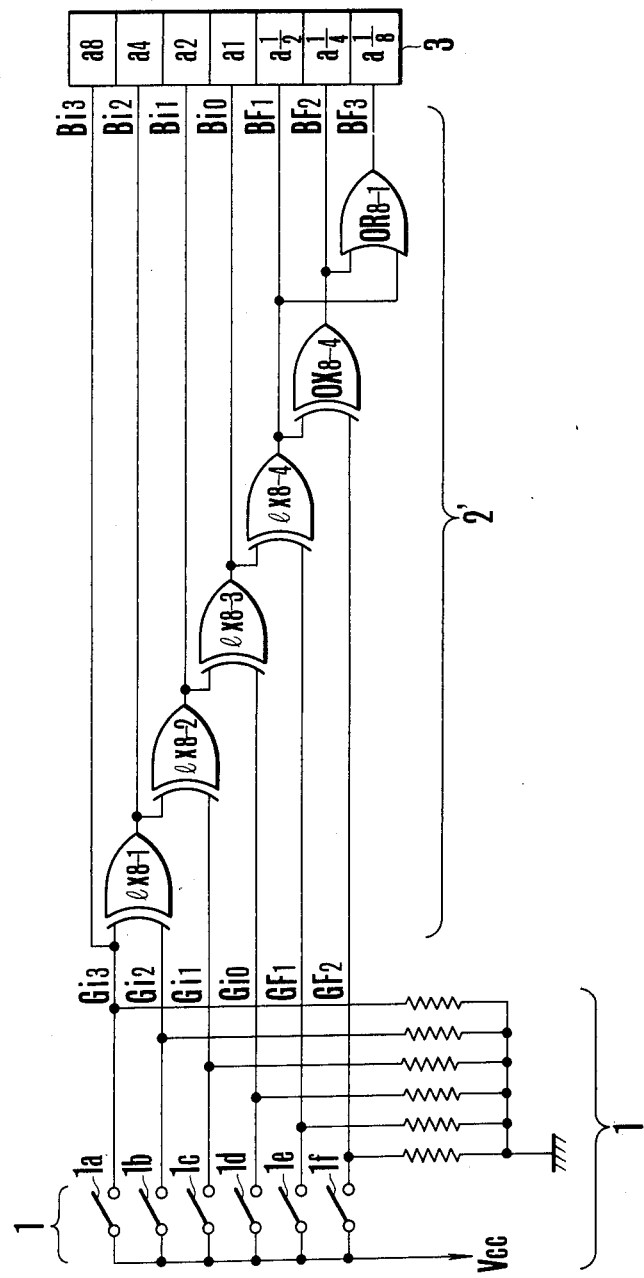
FIG. 8(a) illustrates a circuit which performs code conversion based on the code table of FIG. 7.

FIG. 8 is a circuit 2′ illustrating an embodiment example of converting the code relation shown in the table of FIG. 7. In FIG. 8, a reference numeral 1 indicates a switch arrangement which is the same as the switch shown in FIG. 4(a) and the opening and closing states of which is controlled by the ASA sensitivity setting dial and in response to Gi3 - GF2 shown in the table. A reference numeral 4′ indicates a conversion circuit, which is composed of exclusive OR gates $e \times 8\text{-}1$ - $e \times 8\text{-}4$ and an OR gate OR8-1; and 3 indicates a register which is identical with the register 3 shown in FIG. 4. The relation of the output of the conversion circuit to its input is as follows: Bin+1 ⊕ Gin is obtained to satisfy formula (7) from Bi3 up to Bi0 while BF1, BF2 and BF3 also satisfy formulas (8) - (10) respectively. Therefore the information supplied to the register is converted as shown in the table of FIG. 7 and is supplied there in response to changes that take place by ⅓ step. For example, when the ASA sensitivity dial is operated to set Sv value at 1⅓, the switches 1a - 1c are turned off and switches 1d - 1f are turned on. Then, Gi3 - Gi1 become "0"; Gi0 - GF2 become "1"; Bi3 becomes "0"; Bi2 becomes "0" because it is an exclusive OR between Bi3 and Gi2; then, in the same manner, Bi1, Bi0, BF1 and BF2 become "0", "1", "0" and "1"; and BF3 becomes "1" because it is an OR between BF3 and BF1. In this manner, 0,0,0,1,0,1 and 1 is supplied to the bits of the register. Then, since each bit has been weighted, there obtains $1 + \frac{1}{4} + \frac{1}{8} \approx 1 + \frac{1}{3}$ and information corresponding to ⅓ steps is supplied there.

Figure 8B:
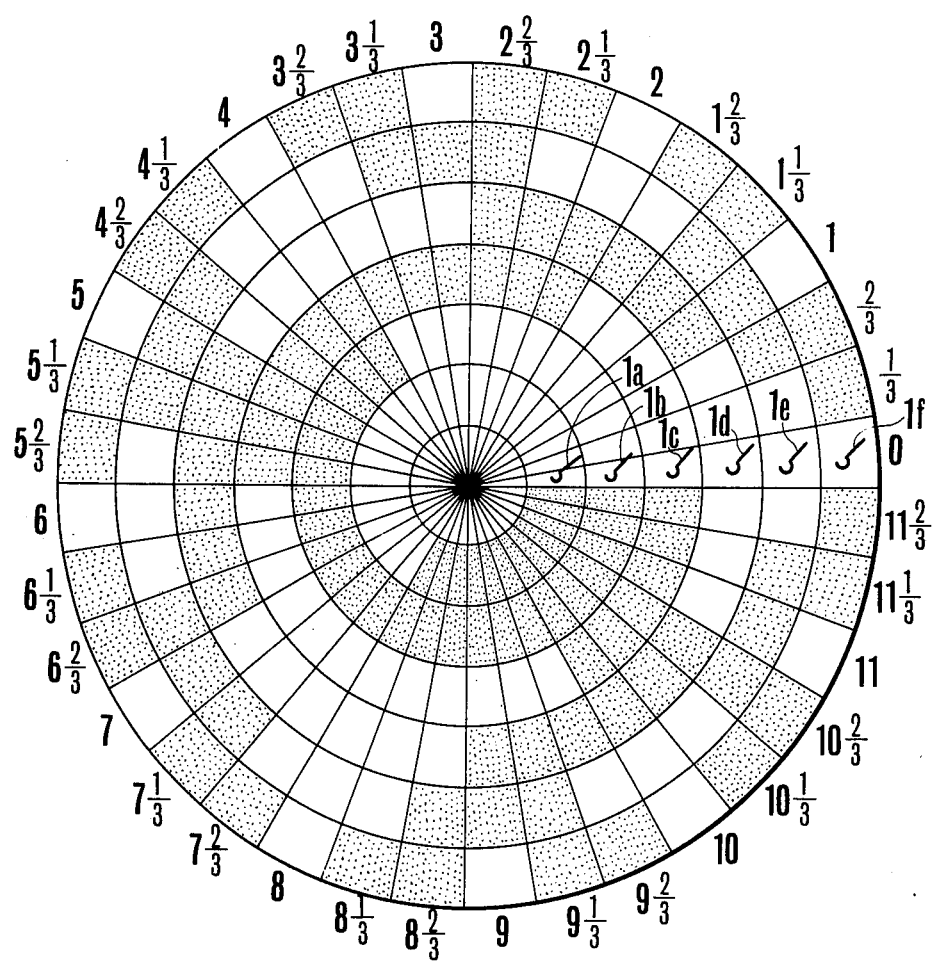
FIG. 8(b) illustrates a code disc corresponding to the code table of FIG. 7.

FIG. 8(b) illustrates a code disc example embodying the code arrangement shown in the table of FIG. 7. The code disc is interlocked with an ASA sensitivity setting dial in the same manner as the embodiment example illustrated in FIG. 4(c).

Figure 9A:
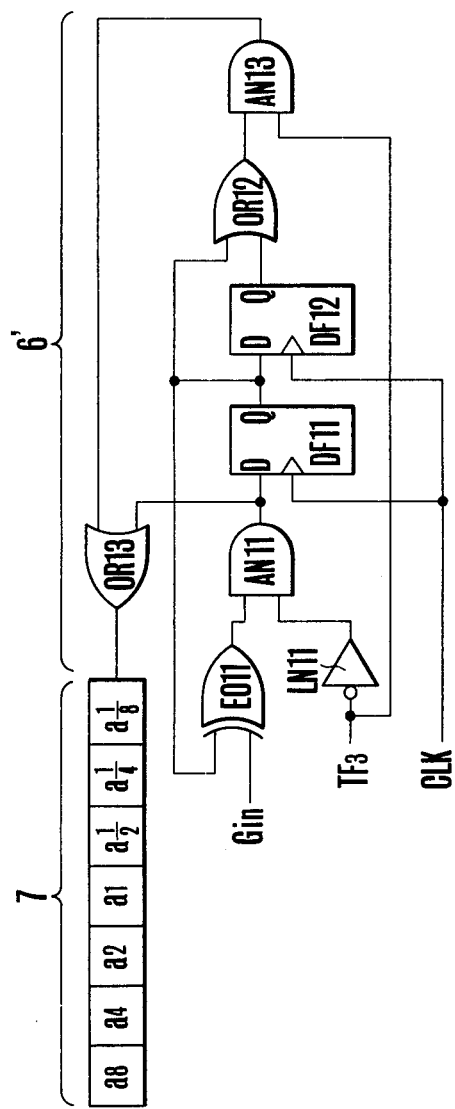
FIG. 9(a) illustrates a modification of the circuit of FIG. 8(a) as another embodiment example.
Figure 9:
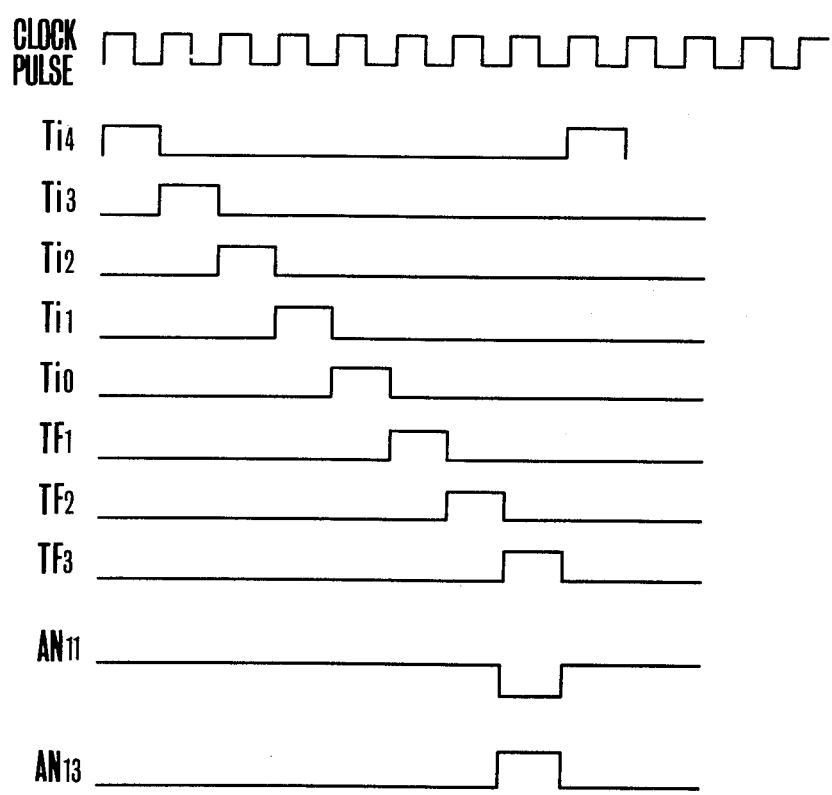
FIG. 9(b) is a timing chart illustrating the timing of the circuit of FIG. 9(a).

FIG. 9(a) is another embodiment example which converts information based on the table shown in FIG. 7. In this example information input is serially accomplished. A reference numeral 7 indicates a shift register which is identical with the shift register 7 shown in FIG. 5; 6′ indicates a conversion circuit which is composed of an exclusive OR gate EO 11, AND gates AN11 and AN13, OR gates OR12 and OR13, an inverter IN11 and delay flip-flop circuits DF11 and DF12. One of the input terminals of the exclusive OR gate EO11 is connected to the output terminal Gin of the ring counter 5 shown in FIG. 5. The input terminal of the inverter IN11 is connected to the output terminal TF3 of the delay flip-flop D7 of the ring counter 5 of FIG. 5.

FIG. 9(b) is a timing chart illustrating the operation of the embodiment illustrated in FIG. 9(a). In this circuit, one of the input terminals of the AND gate AN11 is connected to the output terminal TF3 of the delay flip-flop D7 of the ring counter through the inverter IN11. Therefore, all information that are supplied to $a8$ - $a\frac{1}{4}$ take values that are obtained through the exclusive OR gate EO11 and result from exclusive OR between Gin and the output of the delay flip-flop DF11. Further, since the output of the delay flip-flop DF11 is Bin+1 when the input thereof is Gin, there obtains Bin = Gin ⊕ Bin+1 for $a8$ - $a1$ and thus the output corresponds to formula (7). Then, $a\frac{1}{2}$ takes a value corresponding to Bi0 ⊕ GF1 while $a\frac{1}{4}$ takes a value corresponding to BF1 ⊕ GF2 and thus they respectively take values corresponding to formulas (8) and (9). When the output of TF3 becomes "1", the AND gate AN11 is closed and the AND gate AN13 is opened. Therefore, an OR output is obtained through the OR gate OR12 from the outputs of the delay flip-flop circuits DF11 and DF12. This OR output is then supplied to $a\frac{1}{8}$. At this moment, the output of DF11 and that of DF12 are values BF1 and BF2 which are to be supplied to $a\frac{1}{2}$ and $a\frac{1}{4}$ respectively. Therefore, a value BF1 + BF2 is supplied to $a\frac{1}{8}$ and this corresponds to formula (10).

Figure 10:
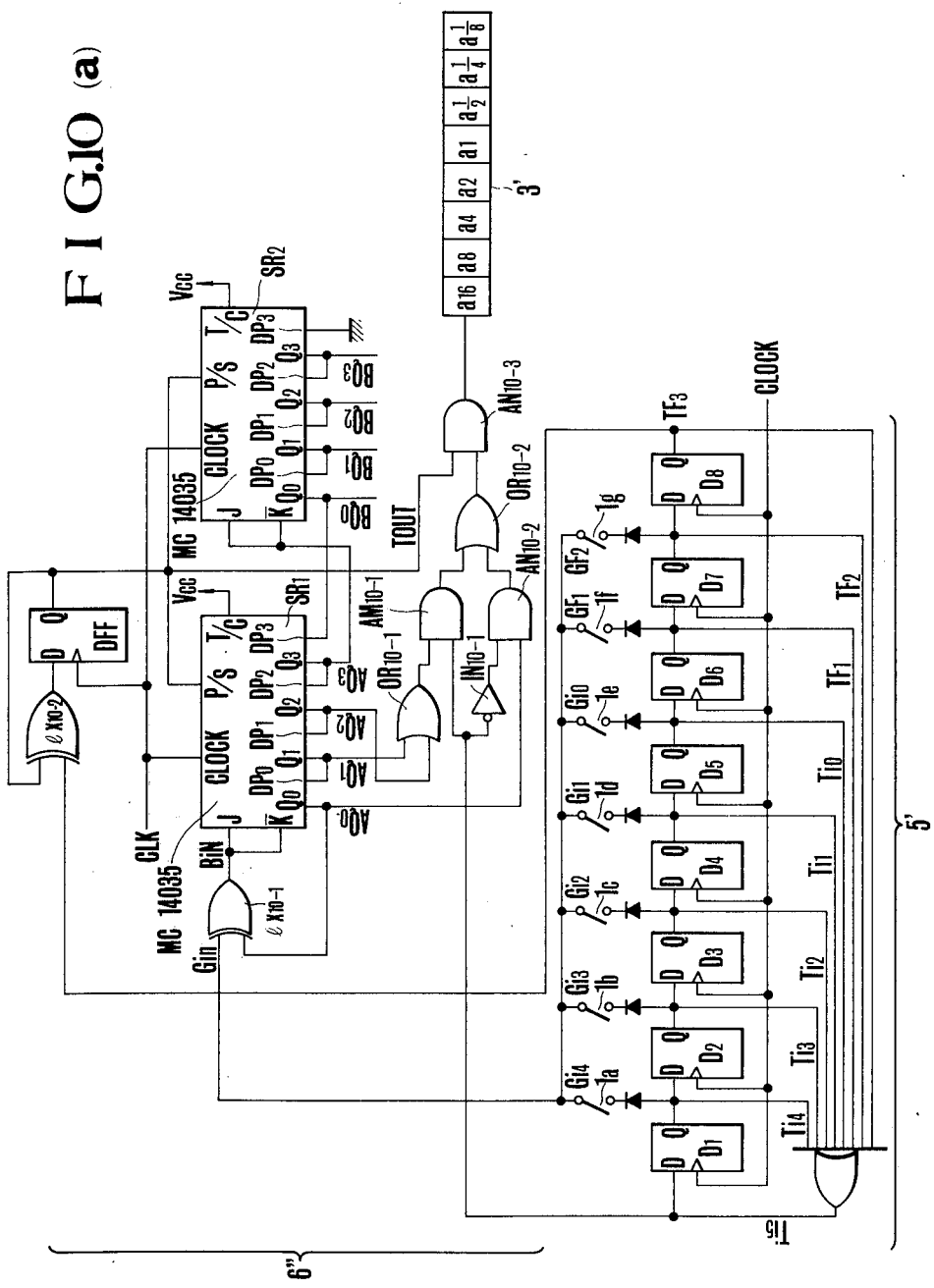
FIG. 10(a) is another modification of the circuit of FIG. 9(a) as another embodiment example.
FIG. 10(b) is a timing chart illustrating the timing of the operation of the circuit of FIG. 10(a).
Figure 10B:
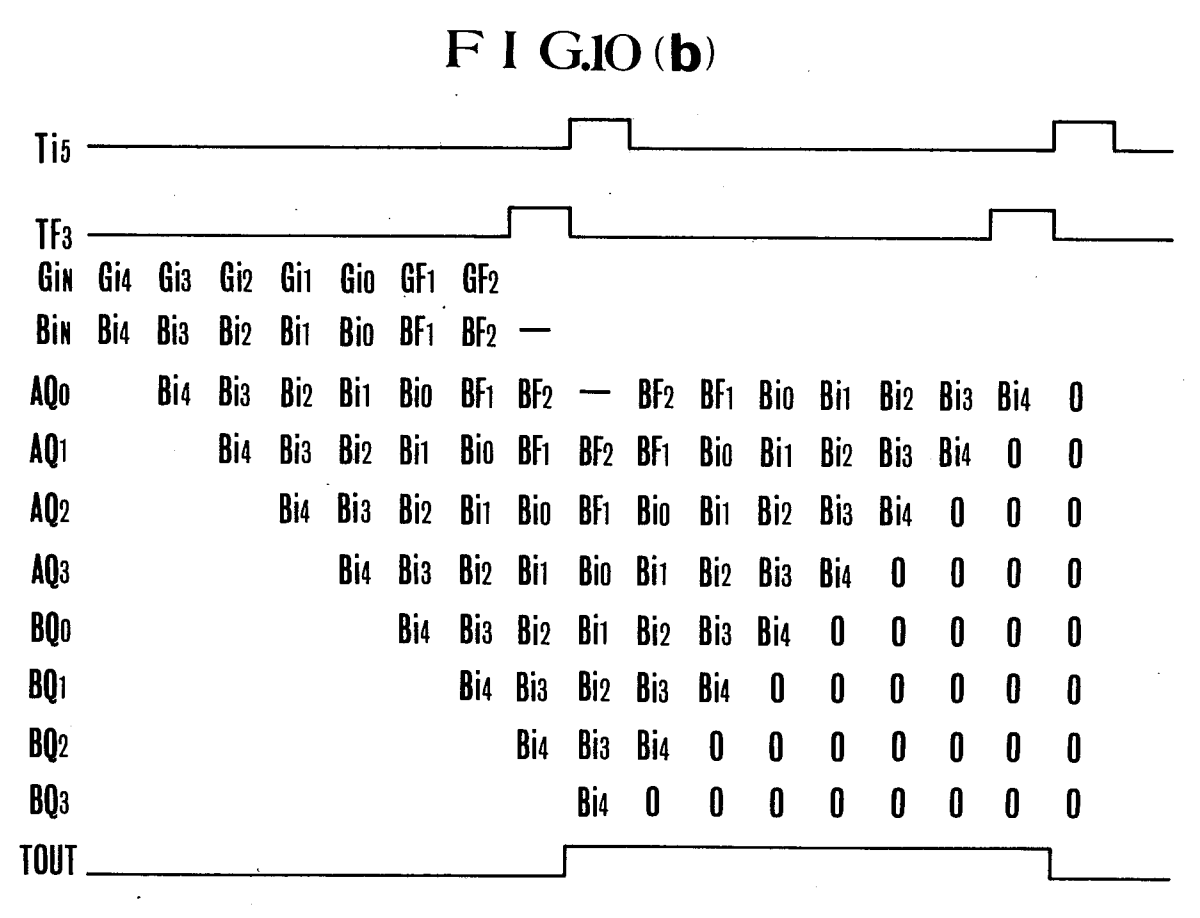

FIG. 10(a) is a circuit diagram which illustrates, as another embodiment of this invention, a code disc embodying the code arrangement shown in FIG. 7. In this embodiment, bits are serially put out from lighter weighted bits to heavier weighted ones. In FIG. 10(a), a reference numeral 5′ indicates a ring counter. In this counter, the constituent elements that are same as those used for the ring counter of FIG. 5 are indicated by the same reference numerals. However, in this case, the ring counter 5′ includes an additional delay flip-flop D8 which is not used in the ring counter of FIG. 5. Reference numerals 1a - 1g indicate switches. In this switch arrangement, 1a through 1e represent an integer part and 1f and 1g a decimal part. Thus, compared with the switch arrangement shown in FIG. 5, the arrangement of FIG. 10(a) has one more bit in the integer part. A reference numeral 6″ indicate a code conversion circuit which is composed of exclusive OR gates ex10-1 and ex10-2, AND gates AN10-1 - AN10-3, OR gates OR10-1 and OR10-2, an inverter IN10-1, a delay flip-flop DFF and a shift registers SR1 and SR2. For the shift registers SR1 and SR2, 4 bit shift registers manufactured by MOTOROLA CO. are employed. When "1" is supplied to the terminals P/S of the registers SR1 and SR2, a leftward shift takes place to produce data in parallel. A reference numeral 3′ is a shift register of 8 bits which are weighted in the same manner as in the case of the register 7 of FIG. 5. However, since the shift register 3′ is of 8 bits, the largest bit $a16$ is weighted with "16". FIG. 10(b) is a timing chart illustrating the operation of the circuit of FIG.10(a), which operates as follows:

Fi4 is set by the on-off operation of the switch 1a; Gi3 is set by switch 1b; Gi2 by the switch 1c; Gi1 by the switch 1d; Gi0 by the switch 1e; GF1 by the switch 1f; and GF2 by the switch 1g. Gi4 through GF2 are supplied to the exclusive OR gate ex10-1 one after another synchronously with the outputs Ti4 through TF2 of the ring counter.

Since the output of DFF is "0" in the initial stage, the shift registers SR1 and SR2 are in a state of shifting the input information rightward. Under such a condition, when the output Ti4 becomes "1," Gin becomes Gi4 and is impressed on one of the input terminals of the exclusive OR gate ex10-1. Since AQO is "0" at this time, the output Bin of the exclusive OR gate becomes Gi4 ⊕ "0" and thus becomes Bi4. Following this, when Ti3 becomes "1", Gin becomes Gi3 and, since AQO is in the previous state, i.e. Bin, it becomes Bi4. Then, since Bin becomes Gi3 ⊕ Bi4 and thus comes to take a value corresponding to formula (7), it becomes Bi3. In this manner, the input data are supplied to the register one after another. These inputs to the register are shifted rightward one after another in accordance with Bin = Bin+1 ⊕ Gin. Thus, the content of each bit is set as shown in FIG. 10(b). Since the output TF3 of D8 becomes "1" after GF2 is supplied as Gin, the output of ex10-2 becomes "1". Under such a condition, when the next clock pulse is supplied, Ti4 through TF3 become "0". Therefore, Ti5 becomes "1"; the AND gate AN10-1 comes to assume an opened state and the AND gate AN10-2 a closed state. On the other hand, the output of the DFF also becomes "1". Therefore, the shift register makes a leftward shift and there obtains a parallel-out condition. Then, the AND gate AN10-3 comes to assume an opened state. The outputs BF2 and BF1 of AQ1 and AQ2 are then supplied to the OR gate OR10-1. The output BF2 + BF1 of the OR gate OR10-1 is supplied to the register through the AND gate AN10-1, the OR gate OR10-2 and the AND gate AN10-3. The next clock pulse causes the contents of the shift register to be shifted leftward and, at the same time, Ti5 becomes "0". Therefore the AND gate AN10-1 comes to assume a closed state and the AND gate AN10-2 an opened state. Then, the content BF2 of AQO is supplied to the register through the AND gate AN10-2, the OR gate OR10-2 and the AND gate AN10-3. Since the register thereafter makes a leftward shift synchronously with the clock pulses, the contents of AQO then becomes BF1, Bi0, Bi1, Bi2, Bi3 and Bi4 as shown in FIG. 10(b). Therefore, BF2 + BF1 = BF3, BF2, BF1, Bi0, Bi1, Bi2, Bi3 and Bi4 are supplied to the register 3' in the above indicated order. Then, $a\frac{1}{8}$ becomes BF3; $a\frac{1}{4}$ becomes BF2; $a\frac{1}{2}$ becomes BF1; $a1$ becomes Bi0; $a2$ becomes Bi1; $a4$ becomes Bi2; $a8$ becomes Bi3; and $a16$ becomes Bi4. Thus, there are obtained the contents which have been code converted in accordance with the table of FIG. 7.

As described in detail in the foregoing, in the digital information conversion system of this invention, the gray code which represents an integer part is converted into a binary code and, at the same time, a code which has the weight of $\frac{1}{2}$ or $\frac{3}{4}$ is converted into a code having the weight of $\frac{1}{2}$, $\frac{1}{4}$ or $\frac{1}{8}$. In the case of a camera or the like where information such as ASA sensitivity or the like that varies by $\frac{1}{3}$ increment or decrement steps is set by means of a gray code, such a gray code can be converted into a binary code, so that the computing operation of the camera can be greatly facilitated in accordance with this invention.

What is claimed is:

1. A code conversion circuit comprising:
   (a) a digital information setting means which has a code pattern portion representing a gray-coded integer part and a code pattern portion consisting of first and second bits representing a decimal part varying with $\frac{1}{3}$ increment or decrement steps, wherein the code pattern of the first and second bits will have a first code pattern when said integer part represents an odd number, and will have a second code pattern when said integer part represents an even number, while values with $\frac{1}{3}$ step variation are set as digital values; and
   (b) a conversion circuit connected to said digital information setting means, wherein said conversion circuit converts a gray-coded integer part into a binary code representing an integer based on the code of the code pattern portion representing said gray-coded integer part, and converts said decimal part with $\frac{1}{3}$ step variation by the code pattern of the first and second bits.

2. A code conversion circuit according to claim 1, for converting said gray-coded integer part into binary code and computing a signal for representing a bit of the lowest place in said binary-coded digital value and an exclusive OR of information of said first bit based on said signal representing the bit of the lowest place and said information of first bit, and converting the same into information having a weight of $\frac{1}{2}$, also for computing the exclusive OR of the information of said first bit and second bit based on said information of the second bit and converting the same into bit information having a weight of $\frac{1}{4}$, and further computing the OR of said bit information having a weight of $\frac{1}{2}$ and the bit information having a weight of $\frac{1}{4}$ based on said bit information and converting the same into bit information having a weight of $\frac{1}{8}$.

3. A code conversion circuit according to claim 2, which includes an exclusive OR circuit which provides bit information of the lowest place in said binary-coded digital values and the information of the first bit.

4. A code conversion circuit according to claim 3, which includes an exclusive NOR circuit which supplies the information of said first and second bits.

5. A code conversion circuit according to claim 4, which includes an OR circuit supplying the outputs of said exclusive OR circuit and the exclusive NOR circuit.

6. A code conversion circuit according to claim 1, which includes:
   (a) a circuit which is connected to said information setting means to have said gray-coded integer portion and the information of the first and second bits provided serially; and
   (b) an information conversion circuit which serially converts the gray-coded information being serially provided into binary code, and at the same time converts the same, together with said information of the first bit, into information having a weight of $\frac{1}{2}$ based on the lowest place in said information converted into binary code when said information of the first bit is provided and, further, which converts the same into information having a weight of $\frac{1}{4}$ based on the information of the second bit when said second bit information is provided, and also converts the same into information having a weight of $\frac{1}{8}$ based on said information having weights of $\frac{1}{2}$ and $\frac{1}{4}$.

7. A code conversion circuit according to claim 1, in which the code patterns of the pattern portion consisting of the first and second bits are arranged to progress as "1, 0", "1, 1", "0, 1" when the pattern portion of the gray code represents an odd number, and as "0, 1", "0, 0", "1, 0" when the pattern portion of the gray code represents an even number.

8. A code conversion circuit according to claim 1, in which the code patterns of the pattern portion consisting of the first and second bits are arranged to progress as "1, 0", "1, 1", "0, 1" when the pattern portion of the gray code represents an odd number, and as "0, 0", "0, 1", "1, 1" when the pattern portion of the gray code represents an even number.

9. A code conversion circuit comprising:
(a) a digital information setting means which has a code pattern portion representing a gray-coded integer part and a code pattern portion consisting of first and second bits representing a decimal part varying with ½ increment or decrement steps, wherein the code pattern of the first and second bits will have a first code pattern when said integer part represents an odd number, and will have a second code pattern when said integer part represents an even number, while values with ½ step variation are set as digital values; and
(b) a conversion circuit which includes:
  (1) a gray code-binary code conversion circuit which is connected to said setting means and converts code representing gray-coded integer portion into a binary-coded digital value;
  (2) a first computation circuit which is connected to said setting means and computes an exclusive OR of the above-mentioned information of the first bit and the binary-coded digital value based on the information at the lowest place in said information;
  (3) a second computation circuit which computes an exclusive NOR of said information of the first and second bits based on said information; and
  (4) a third computation circuit which is connected to said first and second computation circuits and computes an NOR thereof.

10. A code conversion circuit comprising:
(a) a digital information setting means which has a code pattern portion representing a gray-coded integer part and a code pattern portion consisting of first and second bits representing a decimal part varying with ½ increment or decrement steps, wherein the code pattern of the first and second bits will have a first code pattern when said integer part represents an odd number, and will have a second code pattern when said integer part represents an even number, while values with ½ step variation are set as digital values; and
(b) a conversion circuit, which converts said gray code of code pattern into binary code, and at the same time converts the same into information having a weight of ½ based on the lowest place in the information converted into binary code and the information of the first bit, further converts the same into information having a weight of ¼ based on said information having a weight of ½ and said information of the second bit, and also converts the same into information having a weight of ⅛ based on said information having weights of ½ and ¼ respectively.

11. A code conversion circuit according to claim 10, which includes a first computation circuit for computing an exclusive OR of said information in the lowest place and the information of the first bit based on said information.

12. A code conversion circuit according to claim 11, which includes a second computation circuit computing an exclusive OR of said information of the second bit and the output of the first computation circuit.

13. A code conversion circuit according to claim 12, which includes a third computation circuit computing OR of the outputs of the above-mentioned first and second computation circuits based on said outputs.

* * * * *